(12) United States Patent
Goela et al.

(10) Patent No.: US 7,927,915 B2
(45) Date of Patent: Apr. 19, 2011

(54) LOW RESISTIVITY SILICON CARBIDE

(75) Inventors: Jitendra S. Goela, Andover, MA (US); Michael A. Pickering, Dracut, MA (US)

(73) Assignee: Rohm and Haas Company, Philadelphia, PA (US)

( * ) Notice: Subject to any disclaimer, the term of this patent is extended or adjusted under 35 U.S.C. 154(b) by 1592 days.

(21) Appl. No.: 10/872,746

(22) Filed: Jun. 21, 2004

(65) Prior Publication Data

US 2004/0229395 A1 Nov. 18, 2004

Related U.S. Application Data

(60) Division of application No. 10/164,238, filed on Jun. 6, 2002, now Pat. No. 6,939,821, which is a continuation-in-part of application No. 09/790,442, filed on Feb. 21, 2001, now Pat. No. 7,018,947.

(60) Provisional application No. 60/184,766, filed on Feb. 24, 2000.

(51) Int. Cl.
 *H01L 21/00* (2006.01)
(52) U.S. Cl. ...................................... 438/105
(58) Field of Classification Search .............. 438/795, 438/689, 478, 105; 65/66
 See application file for complete search history.

(56) References Cited

U.S. PATENT DOCUMENTS

| | | | |
|---|---|---|---|
| 4,772,498 A | 9/1988 | Bertin et al. | |
| 5,071,596 A | 12/1991 | Goela et al. | |
| 5,332,601 A | 7/1994 | Varacalle et al. | |
| 5,354,580 A | 10/1994 | Goela et al. | |
| 5,374,412 A | 12/1994 | Pickering et al. | |
| 5,465,184 A | 11/1995 | Bertin et al. | |
| 5,474,613 A | 12/1995 | Pickering et al. | |
| 5,612,132 A | 3/1997 | Goela et al. | |
| 5,683,028 A | 11/1997 | Goela et al. | |
| 6,048,403 A | 4/2000 | Deaton et al. | |
| 6,090,733 A | 7/2000 | Otsuki et al. | |
| 6,200,388 B1 | 3/2001 | Jennings | |
| 6,214,755 B1 | 4/2001 | Otsuki et al. | |
| 6,334,335 B1 * | 1/2002 | Hirota et al. ................ | 65/66 |
| 6,537,733 B2 | 3/2003 | Campana et al. | |
| 2002/0004444 A1 | 1/2002 | Goela et al. | |

(Continued)

FOREIGN PATENT DOCUMENTS

EP 0 582 444 A1 2/1994
JP 2000119064 4/2000

OTHER PUBLICATIONS

Matsunami et al., "Step-controlled epitaxy of SiC: high-quality homoepitaxial growth", Diamond and Related Materials 7; pp. 342-347 (1988).

(Continued)

*Primary Examiner* — Tom Thomas
*Assistant Examiner* — Monica D Harrison
(74) *Attorney, Agent, or Firm* — John J. Piskorski (57) ABSTRACT

An opaque, low resistivity silicon carbide and a method of making the opaque, low resistivity silicon carbide. The opaque, low resistivity silicon carbide is doped with a sufficient amount of nitrogen to provide the desired properties of the silicon carbide. The opaque, low resistivity silicon carbide is a free-standing bulk material that may be machined to form furniture used for holding semi-conductor wafers during processing of the wafers. The opaque, low resistivity silicon carbide is opaque at wavelengths of light where semi-conductor wafers are processed. Such opaqueness provides for improved semi-conductor wafer manufacturing. Edge rings fashioned from the opaque, low resistivity silicon carbide can be employed in RTP chambers.

10 Claims, 2 Drawing Sheets

U.S. PATENT DOCUMENTS

| | | |
|---|---|---|
| 2002/0106535 A1 | 8/2002 | Brese et al. |
| 2003/0045098 A1* | 3/2003 | Verhaverbeke et al. ...... 438/689 |
| 2003/0059568 A1 | 3/2003 | Pickering et al. |

OTHER PUBLICATIONS

Swarnima et al., "Microstructural Evolution in Liquid-Phase-Sintered SiC: Part II, Effects of Planar Defects and Seeds in the Starting Powder"; J. Am. Ceram. Soc. 84(7) pp. 1585-1590 (2001).

Bolch et al., "Silicon Carbide Makes Superior Mirrors"; Laser Focus World; pp. 97-105 (Aug. 1989).

Shih et al., "The Application of Hot Pressed Silicon Carbide to Large High-Precision Optical Structures"; SPIE vol. 2543; pp. 24-37 (1995).

Goela et al., "High Thermal Conductivity SiC and Applications" pp. 1-38.

* cited by examiner

LOW RESISTIVITY SILICON CARBIDE

This application is a DIV of Ser. No. 10/164,238 Jun. 6, 2002 U.S. Pat. No. 6,939,821 which is a CIP of Ser. No. 09/790,442 Feb. 21, 2001 U.S. Pat. No. 7,018,947 which claims benefit of 60/184,766 Feb. 24, 2000.

BACKGROUND OF THE INVENTION

The present invention is directed to an improved low resistivity silicon carbide. More specifically, the present invention is directed to an improved low resistivity silicon carbide that has a high nitrogen concentration.

Silicon carbide (SiC), especially silicon carbide produced by chemical vapor deposition (CVD), has unique properties that make it a material of choice in many high temperature applications. Chemical vapor deposition processes for producing free-standing silicon carbide articles involve a reaction of vaporized or gaseous chemical precursors in the vicinity of a substrate to result in silicon carbide depositing on the substrate. The deposition reaction is continued until the deposit reaches the desired thickness. To be free standing, the silicon carbide is deposited to a thickness of upward of 0.1 mm. The deposit is then separated from the substrate as a free-standing article that may or may not be further processed by shaping, machining, or polishing and the like to provide a final silicon carbide article.

In a chemical vapor deposition silicon carbide production run, a silicon carbide precursor gas, such as a mixture of methyltrichlorosilane (MTS), hydrogen and argon, is fed to a deposition chamber where the mixture is heated to a temperature at which the mixture reacts to produce silicon carbide. Hydrogen scavenges chlorine that is released from the MTS when the MTS dissociates during the reaction. An inert, non-reactive gas such as argon or helium is employed as a carrier gas for MTS (a liquid at room temperature). Inert gases also act as a diluent whose flow rate can be varied to optimize the reaction and assures removal of by products from the reaction/deposition zone. The silicon carbide deposits as a layer or shell on a solid mandrel provided in the deposition chamber. After the desired thickness of silicon carbide is deposited on the mandrel, the coated mandrel is removed from the deposition chamber and the deposit separated therefrom. The monolithic free-standing article may then be machined to a desired shape. Several CVD-SiC deposition systems are described in U.S. Pat. Nos. 5,071,596; 5,354,580; and 5,374,412.

Pure CVD-SiC has relatively high electrical resistivity. While this is a desirable characteristic for certain applications, such a characteristic is a limitation restricting its use in other applications. Certain components, such as plasma screens, focus rings used in plasma etching chambers need to be electrically conductive, and edge rings and susceptors used in the RTP systems need to be opaque and possess high temperature stability. While high temperature properties of CVD-SiC have made it a material of choice for use in such chambers, its high resistivity has limited its use in fabricating components that require a greater degree of electrical conductivity.

High electrical resistivity of CVD-SiC has further restricted its use in applications that are subject to the buildup of static electricity. The need to ground components used in such applications requires that they possess greater electrical conductivity than is generally found in CVD-SiC. A low resistivity silicon carbide can provide a unique and useful combination of high temperature properties with suitable electrical conductivity properties for use in applications where grounding is required.

The semiconductor industry uses CVD-SiC components of different electrical resistivity. Different resistivity components provide different electrical coupling to plasma (i.e. absorbs different amounts of energy from the plasma) in plasma etch chambers. High resistivity SiC components, i.e., 1000 to 5000 ohm-cm, such as gas diffuser plates, do not absorb much energy from the plasma and thus are used in those areas of the etch chamber where plasma energy is not affected. In contrast, low resistivity components such as plasma screens and liners absorb energy from the plasma and thus prevent plasma from spreading beyond the components. If the plasma is permitted to spread beyond the low resistivity components, it will generate heat in the system which will degrade the equipment.

Regardless of whether the CVD-SiC is of a high or low electrical resistivity, a uniform resistivity is always desired. A uniform electrical resistivity provides for less variation in the performance of the SiC component whether it is functioning as a gas diffuser plate or as an edge ring. A SiC article with uniform resistivity also heats the components uniformly, thus reducing the temperature gradients and the thermal stresses in the material. A uniform electrical resistivity of a SiC component is less susceptible to cracking in extreme environments employed in manufacturing semiconductors such as in the extreme environments of rapid thermal processing (RTP).

U.S. patent application Ser. No. 09/790,442, filed Feb. 21, 2001, (non-provisional of provisionally filed U.S. application 60/184,766, filed Feb. 24, 2000), assigned to the assignee of the present application discloses a chemical vapor deposited low resistivity silicon carbide (CVD-LRSiC) and method of making the same. Electrical resistivity of the silicon carbide is 0.9 ohm-cm or less. In contrast, the electrical resistivity of relatively pure silicon carbide, prior to the CVD-LRSiC of the application Ser. No. 09/790,442, is in excess of 1000 ohm-cm. The method of preparing the CVD-LRSiC employs many of the same components as the CVD methods disclosed above except that nitrogen is also employed. The lower resistivity of the silicon carbide is believed to be attributable to a controlled amount of nitrogen throughout the silicon carbide as it is deposited by CVD. Controlled means that the nitrogen is maintained at a constant concentration during SiC deposition. The nitrogen is incorporated in the deposit by providing a controlled amount of nitrogen with the precursor gas in the gaseous mixture that is fed to the reaction zone adjacent a substrate. The reaction is carried out in an argon gas atmosphere. Nitrogen concentration in the gaseous reaction mixture does not exceed 32% by weight of the mixture. At such nitrogen concentrations, the physical properties of SiC, other than the electrical resistivity, do not change such as to affect performance of SiC articles in thermal processing applications. As the silicon carbide precursor reacts to form the silicon carbide deposit, nitrogen from the gaseous mixture is incorporated into the deposit. The CVD-LRSiC contains at least $6.3 \times 10^{18}$ atoms of nitrogen per cubic centimeter of CVD-LRSiC. The electrical resistivity of the SiC was below 0.9 ohm-cm. Such low electrical resistivity is highly desirable and are suitable for use in thermal processing methods. However, the electrical resistivity of the SiC was not as uniform as the industry preferably desires. SiC samples ranged down to 0.1 ohm-cm with a mean electrical resistivity of around 0.52 ohm-cm with a variation around the mean of about 80%. Although such SiC is suitable for thermal processing methods, there is still a need for a SiC with a more uniform electrical resistivity and a lower variation around the mean.

U.S. patent application Ser. No. 10/000,975 filed Oct. 24, 2001 also assigned to the assignee of the present application discloses another chemical vapor deposited low resistivity silicon carbide article. The silicon carbide has an improved electrical resistivity of less than 0.10 ohm-cm and is opaque at wavelengths of from 0.1 μm to 1.0 μm at a temperature of at least 250° C. The improvements in the electrical resistivity as well as the opacity were achieved without compromising other SiC properties such as thermal conductivity, flexural strength and thermal stability. The improved electrical resistivity and other properties were achieved by increasing the nitrogen incorporated into the SiC. Nitrogen content reached $3 \times 10^{19}$ atoms of nitrogen per cubic centimeter of SiC. Nitrogen content was increased by increasing nitrogen volume to as high as 50% in the deposition chamber. Surprisingly, the increase in nitrogen concentration did not compromise the thermal conductivity or other important SiC properties. Altering reaction components and chamber conditions may affect the stoichiometry of SiC reactants such that the resulting SiC may have reduced properties, such as thermal conductivity, and may be prone to cracking. Thus, a worker may not readily predict the quality of SiC that he may obtain by altering reaction parameters based on previous SiC synthesis processes.

While the resistivity of CVD-SiC can theoretically be lowered to a desired level by the introduction of a sufficient amount of impurities, such as boron, the resulting elevated levels of impurities adversely affect other properties of the SiC such as thermal conductivity and/or high temperature stability. The CVD-LRSiC is relatively free of impurities, containing less than 10 ppmw of impurity trace elements as determined by gas discharge mass spectroscopy. The CVD-LRSiC is further characterized by a thermal conductivity of at least 195 Watts/meter degree Kelvin (W/mK) and a flexural strength of at least 390 MPa.

The electrically conductive CVD-LRSiC possesses high temperature stability in addition to being a high purity SiC. Thus, the free standing CVD-LRSiC may be readily employed in high temperature furnaces such as semiconductor processing furnaces and plasma etching apparatus. The CVD-LRSiC may be sold as a bulk material or may be further processed by shaping, machining, polishing and the like to provide a more finished free-standing article. For example, the CVD-LRSiC may be machined into plasma screens, focus rings and susceptors or edge rings for semi-conductor wafer processing and other types of high temperature processing chamber furniture as well as other articles where CVD-LRSiC material is highly desirable.

In the manufacture of semi-conductor wafers, there are numerous process steps. One set of steps is referred to as epitaxial deposition, and generally consists of depositing a thin layer (from 10 to less than one micron) of epitaxial silicon upon the wafer. This is achieved using specialized equipment such as SiC wafer boats or SiC susceptors or edge rings to secure the semi-conductor wafers in processing chambers, and a chemical vapor deposition (CVD) process. The CVD process requires that the wafer be heated to very high temperatures, on the order of 1200° C. (2000° F.).

There has been a recent trend in the semi-conductor art to employ equipment that operates upon a single wafer, rather than a group of wafers. In single wafer equipment, the heating of the wafer to the CVD temperature is greatly accelerated such that the wafer is taken from about room temperature to an elevated temperature within 30 seconds. Such processing is known as rapid thermal processing or RTP. Rapid thermal processing (RTP), for example, is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). Temperatures in an RTP chamber may exceed 1100° C. and are subject to rapid change, thereby making precise control of the substrate temperature complicated and difficult. RTP includes depositing various thin films of different materials by an RTP-CVD process, rapid annealing of wafers (RTP thermal processing) and rapid oxidation to form silicon dioxide. While the silicon wafer can accept such rapid temperature change well, the wafer must be held in position by a susceptor or edge ring that can also withstand such rapid temperature changes. Susceptor or edge rings composed of CVD-SiC or CVD-LRSiC have proved very suitable for withstanding RTP conditions.

Many RTP systems employ high intensity tungsten (W) halogen lamps to heat semi-conductor wafers. Pyrometers are used to measure and to control wafer temperature by controlling the output of the W-halogen lamps. Accurate and repeatable temperature measurements for wafers over a wide range of values are imperative to provide quality wafers that meet the requirements for integrated circuit manufacturing. Accurate temperature measurement requires accurate radiometric measurements of wafer radiation. Background radiation from W-halogen lamps (filament temperature of 2500° C.) or from other sources can contribute to an erroneous temperature measurement by the pyrometer especially at low temperatures (400° C.) where the radiant emission from the wafer is very low compared to the lamp output. Also, any light from the W-halogen lamps that passes through (transmits) a susceptor or edge ring can cause an incorrect temperature reading by the pyrometer.

The industry has addressed the temperature problems by designing the RTP chamber with single sided heating and mounting the pyrometers on the chamber bottom opposite the light source. To further reduce light interference, the area under the wafer was made "light tight", thus eliminating stray reflected light from entering the area under the wafer. In addition to redesigning the RTP chamber, CVD-SiC or CVD-LRSiC edge rings and susceptors were made more opaque to W-halogen lamp light in the wavelength range that pyrometers operate by coating the rings with about 200 μm (0.008 inches) of poly-silicon to reduce the lamp light that passes through the edge rings. Examples of such edge rings which are made more opaque to lamp light are disclosed in U.S. Pat. No. 6,048,403 and U.S. Pat. No. 6,200,388 B1. However, although opaqueness may be increased, coating edge rings with poly-silicon adds substantial cost to the edge rings. Further, the coating process (epitaxial silicon growth) has many technical problems associated with it such as dendritic growth, bread loafing around edges and purity problems that reduce yields. Poly-silicon coating adds thermal mass to the edge rings. The increased thermal mass limits heating ramp rates during RTP processing cycles. Ideally, edge rings have a thermal mass that is as low as possible to achieve the fastest heating ramp rates. The faster the ramp rate the shorter the processing cycle time for wafers, thus reducing wafer processing costs. Another advantage to faster ramp rates is that the total integrated time at high temperature for the wafers is reduced allowing for less diffusion of any dopant species employed during processing. Such is highly desirable as the feature sizes decrease for semi-conductor devices (trend in the semi-conductor industry).

Although there are CVD-LRSiC articles that may be employed in semi-conductor wafer processing chambers, there is still a need for improved CVD-LRSiC articles that have improved opaqueness and that do not need coatings to achieve a desired opaqueness. Additionally, there is also a need for CVD-LRSiC articles that have more uniform electrical resistivity.

SUMMARY OF THE INVENTION

The present invention is directed to a silicon carbide that has a nitrogen content greater than $3 \times 10^{19}$ atoms/cm$^3$. Advantageously, the silicon carbide of the present invention has a resistivity of less than 0.10 ohm-cm with a variation around an electrical resistivity mean of less than 35%. Such a uniform low resistivity silicon carbide provides for improved performance as furniture in thermal processing methods, and is less susceptible to cracking in extreme environments. Advantageously, the silicon carbide is opaque to light in a wavelength range of from 0.1 μm to 1.0 μm. Silicon carbide of the present invention may be employed as furniture in semi-conductor processing chambers where accurate maintenance of semiconductor wafer temperatures are desired. Since the low resistivity silicon carbide is opaque at wavelengths of light from 0.1 μm to 1.0 μm, light from heating lamps employed in wafer processing chambers is significantly reduced, thus allowing a more accurate reading of wafer temperatures. Accordingly, defects in wafers caused by improper temperatures are reduced or eliminated.

Further, because the low resistivity silicon carbide need not be coated with poly-silicon to provide the appropriate opaqueness, such problems as dendritic growth, bread loafing and the high cost of coating are eliminated. Also, the problem of adding thermal mass to silicon carbide articles is eliminated. Thus, faster heating ramp rates for rapid thermal processing are achieved with articles prepared from the low resistivity silicon carbide of the present invention. The faster heating ramp rates in turn provide for reduced total integrated time at high temperatures for wafers and reduced diffusion of dopant during processing.

The present invention is also directed to a method of making the opaque, low resistivity silicon carbide. The silicon carbide of the present invention is prepared by chemical vapor deposition. Gas phase nitrogen concentrations of at least 56% by volume are employed in the CVD process. Reactants are mixed together with the high concentrations of nitrogen in a CVD chamber, and the silicon carbide product is deposited on a substrate such as a mandrel. Total furnace pressure during the CVD process is at least 300 torr. Surprisingly, by increasing total furnace pressure to at least 300 torr to increase nitrogen concentration, desirable properties such as thermal conductivity, thermal stability and the like are not compromised. Accordingly, the silicon carbide articles may readily be employed CVD and RTP processes.

In addition to having low resistivity and to being opaque to light at wavelengths of from 0.1 μm to 1.0 μm, the opaque, low resistivity silicon carbide is stable at high temperatures, has a high thermal conductivity and is of a high purity. The opaque, low resistivity silicon carbide may be removed from the mandrel and retained in bulk form or may be shaped, machined and polished to provide a final article.

A primary objective of the present invention is to provide for a free standing, low resistivity silicon carbide with a nitrogen content greater than of $3 \times 10^{19}$ atoms/cm$^3$.

Another objective of the present invention is to provide for a free standing, low resistivity silicon carbide that is opaque to light at wavelengths of from 0.1 μm to 1.0 μm.

A further objective of the present invention is to provide a thermally stable free standing, low resistivity silicon carbide.

An additional objective of the present invention is to provide a free standing, low resistivity silicon carbide that has a high purity.

Still yet, a further objective of the present invention is to provide a method of making an opaque, low resistivity silicon carbide.

Other objectives and advantages of the present invention may be ascertained by a person of skill in the art after reading the following disclosure and the appended claims.

DETAILED DESCRIPTION OF THE INVENTION

Chemical vapor deposited (CVD) silicon carbide (SiC) of the present invention has a nitrogen content of greater than $3 \times 10^{19}$ atoms/cm$^3$. The silicon carbide has low electrical resisitivity of less than 0.10 ohm-cm, and is opaque to light at wavelengths of from 0.1 μm to 1.0 μm. Such silicon carbide is bulk or free-standing, i.e., self-supporting. Bulk or free-standing silicon carbide is distinguished from thin film silicon carbide which is deposited upon a surface with the intent that the silicon carbide remain permanently bonded to the surface. Bulk or free-standing silicon carbide can be machined and polished to a desired size and shape. Such silicon carbide may be employed as furniture in processing chambers for chemical vapor deposition (CVD), rapid thermal processing (RTP), epitaxial deposition and the like. In addition to having a low resistivity and being opaque to light at wavelengths of from 0.1 μm to 1.0 μm, the silicon carbide has a high thermal conductivity, high flexural strength, and high thermal stability. The opaque, low resistivity silicon carbide is substantially free of metallic impurities containing less than about 3 ppmw of trace elements such as boron, phosphorous and the like as determined by gas discharge mass spectroscopy. Additionally, the opaque, low resistivity silicon carbide has reduced thermal mass.

The opaque, low resistivity silicon carbide is prepared by chemical vapor deposition. To provide a substantially opaque, low resistivity silicon carbide, high concentrations of nitrogen are incorporated into the CVD silicon carbide. High concentrations of nitrogen are incorporated into the silicon carbide by providing a high concentration nitrogen atmosphere for the silicon carbide precursors to react. Nitrogen atmosphere means that no inert, non-reactive gases such as argon, helium or other noble gas are employed in preparing the opaque, low resistivity silicon carbide. The atmosphere composes at least 56% by volume of nitrogen, preferably from 56% to 90% by volume of nitrogen. More preferably the atmosphere composes from 60% to 90% by volume of nitrogen to obtain the desired nitrogen content and electrical resistivity of silicon carbide. The remainder of the atmosphere is composed of hydrogen gas and silicon carbide precursors. Nitrogen is incorporated into silicon carbide in amounts of greater than $3 \times 10^{19}$ atoms of nitrogen per cubic centimeter of silicon carbide. Preferably, nitrogen is incorporated into the silicon carbide in amounts of from $5 \times 10^{19}$ to $1 \times 10^{20}$ atoms/cm$^3$, more preferably from $7 \times 10^{19}$ to $1 \times 10^{20}$ atoms/cm$^3$. While not being bound to theory, nitrogen is believed to act as a dopant that reduces band gaps in the silicon carbide to reduce electrical resistivity. Surprisingly, raising the percentage or concentration of nitrogen to 56% by volume or greater increases the amount of nitrogen incorporated into the silicon carbide without nitrogen saturation. Further, the amount of nitrogen incorporation from $3 \times 10^{19}$ atoms/cm$^3$ to $1 \times 10^{20}$ atoms/cm$^3$ unexpectedly provides for both decreased electrical resistivity and a more uniform electrical resistivity. Nitrogen may be employed in any suitable form such as $N_{2(g)}$, volatile organic compounds containing —$NO_2$ or amine groups such as —$NH_2$, compounds of —$N(H)_4^+$ and quaternary amines, $NO_3^-$ salts in aqueous form, halogen containing nitrogen compounds, and the like. Examples of suitable nitrogen compounds include $NF_3$ and $NH_3$.

Silicon carbide precursor is selected from any suitable material that can be reacted to form silicon carbide. Such materials include a component, such as a silane or a chlorosilane, which can react to form a silicon moiety and a component such as a hydrocarbon that can react to form a carbon moiety. The component contributing the silicon moiety can be different from, or can be the same as, the component contributing the carbon moiety. Hydrocarbon substituted silanes, are preferred silicon carbide precursors because they contain both the silicon carbide moieties in a single compound. The precursor(s) or reactant(s) can be a compound which dissociates at the reaction conditions forming one or both of the silicon carbide moieties, or the precursors can be two or more compounds which react to provide one or both of the moieties. While the precursor(s) needs to be in the gas phase when reacted in the vicinity of the substrate, it is not necessary that the precursor's boiling point be less than ambient temperature. Methyltrichlorosilane (MTS) is a preferred precursor, especially when used with hydrogen ($H_2$), which scavenges chlorine released when MTS dissociates. Since MTS provides both silicon and carbon in a stoichiometric ratio of 1:1, no other source of silicon and carbon moieties is required. Silicon carbide of the present invention may be prepared by any suitable method in the art provided that a nitrogen atmosphere in the reaction chamber is at least 56% by volume. $H_2$/MTS molar ratios may range from 2 to 10, preferably from 4 to 10. Hydrogen partial pressures may range from 92 torr to 130 torr, preferably 100 torr to 115 torr. MTS partial pressures may range from 16 torr to 30 torr, preferably from 20 torr to 25 torr.

Nitrogen may be provided in any suitable form as long as the form is sufficiently volatile or may be made sufficiently volatile to form a gas. Nitrogen partial pressures may range from 191 torr to 675 torr, preferably from 200 torr to 560 torr. No inert, non-reactive gases such as argon, helium or other noble gas are employed in preparing the opaque, low resistivity silicon carbide.

Total deposition chamber or furnace pressures range from 300 torr to 835 torr, preferably from 320 torr to 700 torr. The furnace pressures equal the sum of the partial pressures of the reactants. Such high total furnace pressures provide for the desired nitrogen concentrations in the silicon carbide. Deposition chamber temperatures range from 1250° C. to 1400° C., preferably from 1300° C. to 1375° C.

Flow rates may vary depending upon the specific apparatus employed. Generally, the flow rate of MTS ranges from 15 slpm to 50 slpm. The flow rate of hydrogen ranges from 25 slpm to 150 slpm, and the flow rate of nitrogen ranges from 70 slpm to 700 slpm.

Deposition substrates may be composed of any suitable material that can withstand the harsh conditions of the deposition chambers. An example of a suitable substrate or mandrel for depositing silicon carbide is graphite. Graphite mandrels as well as other types of mandrels may be coated with a release agent such that deposited silicon carbide may be readily removed from the mandrel after deposition. Silicon carbide deposits may be removed from mandrels by controlled oxidation (controlled combustion).

Figure 1:
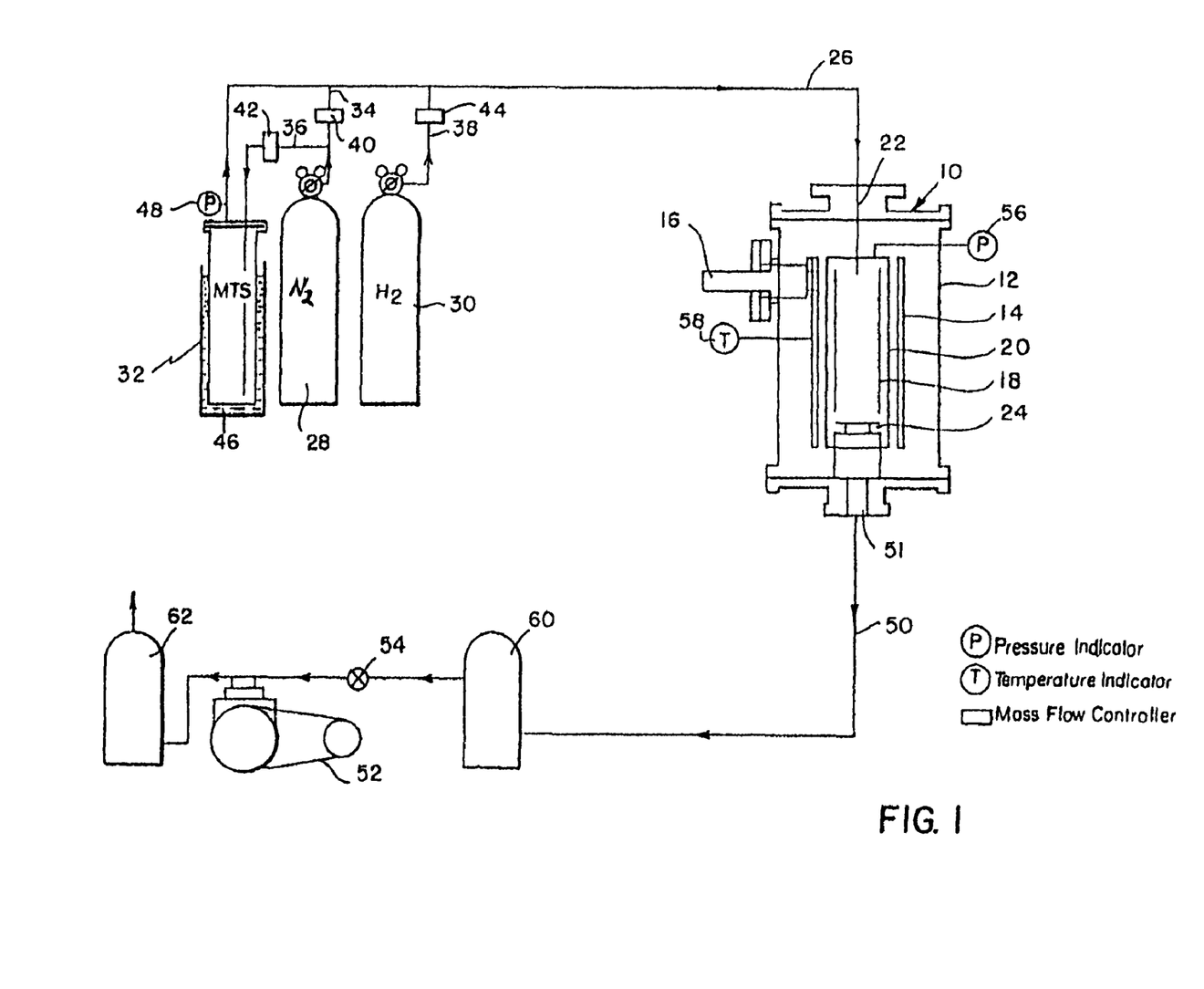
FIG. 1 is a schematic of a CVD apparatus that may be used to fabricate opaque, low resistivity silicon carbide.

An example of a chemical vapor deposition system for producing opaque, low resistivity silicon carbide articles of the present invention is illustrated in FIG. 1. Deposition is carried out within furnace 10. A stainless steel wall provides a cylindrical deposition chamber 12. Heating is provided by a graphite heating element 14 which is connected to an external power supply by an electrode 16. Graphite deposition mandrels are arranged within a graphite isolation tube 20 and gas is introduced by means of an injector 22 through the upper end of the isolation tube so that the reaction gases sweep along mandrels 18. One or more baffle(s) 24 is used to control the aerodynamics of gas flow through furnace 10.

Line 26, which supplies injector 22, is fed by a nitrogen cylinder 28, a hydrogen cylinder 30, and a MTS bubbler 32. Nitrogen is fed by lines 34 and 36 both directly to inlet line 26 and through bubbler 32. The hydrogen cylinder 30 is connected by line 38 to the inlet line 26. Nitrogen flow through lines 32 and 36 and hydrogen flow through line 38 are controlled by mass flow controllers 40, 42, and 44. The MTS bubbler 32 is maintained at a constant temperature by a constant temperature bath 46. A pressure gauge 48 is connected to a feed back loop that controls the gas pressure of bubbler 32.

Outlet line 50 is connected to a bottom outlet port 51. Pressure within the deposition chamber 12 is controlled by a vacuum pump 52 which pulls gases through the chamber and a furnace pressure control valve 54 operably connected to the vacuum pump. Temperature and pressure within deposition chamber 12 are measured by thermal probe 58 and pressure indicator 56. Exhaust gases are passed through filter 60 to remove particulate material upstream of the pressure control valve and through a scrubber 62 downstream of the vacuum pump to remove HCl. Other examples of such processes and the apparatus employed are described in U.S. Pat. No. 5,354,580. U.S. Pat. No. 5,374,412 and U.S. Pat. No. 5,474,613, the disclosures of which are hereby incorporated herein in their entireties by reference.

After deposition the bulk or free-standing silicon carbide may be sold in bulk form or further processed by shaping, machining, polishing and the like to form a desired article. Further processing involves numerous methods that are well known in the art for free-standing silicon carbide. Such methods often involve diamond polishing and machining. An example of an article made from the silicon carbide is a susceptor or edge ring employed to hold or secure semiconductor wafers for processing in furnaces or other suitable chambers.

Advantageously, the free-standing low resistivity silicon carbide becomes opaque at light wavelengths of from 0.1 μm to 1.0 μm, typically from 0.7 μm to 0.95 μm. Low resistivity silicon carbide may remain opaque to light at wavelengths of from 0.1 μm to 1.0 μm at temperatures of from 20° C. to temperatures of up to 1475° C., typically from 300° C. to 1300° C. Opaque means that light transmitted through the silicon carbide has an absorption coefficient that ranges from 259 cm$^{-1}$ to 1000 cm$^{-1}$, typically from 270 cm$^{-1}$ to 800 cm$^{-1}$. Thickness of such opaque, low resistivity silicon carbide ranges from 0.05 mm to 2.00 mm, typically from 0.1 mm to 1.0 mm. At such wavelengths, silicon carbide articles do not substantially transmit light and are highly suitable for furniture in semi-conductor processing chambers. Such chambers include, but are not limited to, RTP processing chambers where pyrometers that operate at wavelengths of 0.7 μm to 0.95 μm monitor semi-conductor wafer temperatures. Such RTP chambers may operate at temperatures of from 300° C. to 1250° C. Opaque low resistivity silicon carbide of the present invention remains opaque to light at wavelengths of from 0.1 μm to 1.0 μm at such temperatures. Since the opaque, low resistivity silicon carbide does not substantially transmit light at wavelengths where pyrometers operate, temperature readings of semi-conductor wafers are more accurate when processed on furniture composed of the silicon carbide of the present invention. Thus, fewer defects occur in processed wafers and both manufacturing and cost efficiency are improved.

Since the low resistivity silicon carbide is opaque to light wavelengths at which a pyrometer operates, susceptors or edge rings employed in RTP need not be coated with poly-silicon. Accordingly, articles composed of silicon carbide within the scope of the present invention eliminate the problems of epitaxial silicon growth such as dendritic growth, bread loafing and any impurities that may occur during the poly-silicon coating process. Such impurities may lead to contamination of semi-conductor wafers during RTP. Elimination of the poly-silicon coating process also reduces overall cost of making silicon carbide articles as well as processing semi-conductor wafers.

Additionally, elimination of unnecessary coatings on edge rings reduces the thermal mass of the edge rings and further improves the RTP in semi-conductor wafer manufacturing. Reduced thermal mass permits faster ramp rates in RTP, thus reducing semi-conductor processing cycle time, and reducing wafer processing costs. Further, as ramp rates increase the total integrated time at high temperatures for wafers is reduced allowing for less diffusion of any dopant species in the RTP. Reduced diffusion of dopant species into semi-conductor wafers in turn permits features on the wafers to be decreased in size (an industry goal).

Low electrical resistivity of the silicon carbide of the present invention is also desirable for radio frequency (RF) heated susceptors to couple the RF field to the susceptor and for components in the plasma etch chamber to couple the plasma energy to the component. In addition, due to low resistivity the wafer holders can be grounded and do not build a static charge on them. Articles made from the low resistivity silicon carbide include, but are not limited to, edge rings or susceptor rings, wafer boats, epi susceptors, plasma etch components, focused rings, plasma screens and plasma chamber walls, and the like. Because the silicon carbide of the present invention has a low resistivity, the silicon carbide may be employed as components in electrical devices such as electrodes and heating elements. In addition to having a low electrical resistivity, the electrical resistivity is more uniform. Chemically vapor deposited low electrical resistivity silicon carbide prepared by the method of the present invention may have an electrical resistivity of less than 0.10 ohm-cm. Preferred silicon carbide prepared by the method of the present invention has an electrical resistivity of from 0.01 ohm-cm to 0.08 ohm-cm. The average value for the electrical resistivity is from 0.02 ohm-cm to 0.06 ohm-cm with an electrical resistivity variance around the mean of less than 35%, typically from 25% to 30%.

Figure 2A:
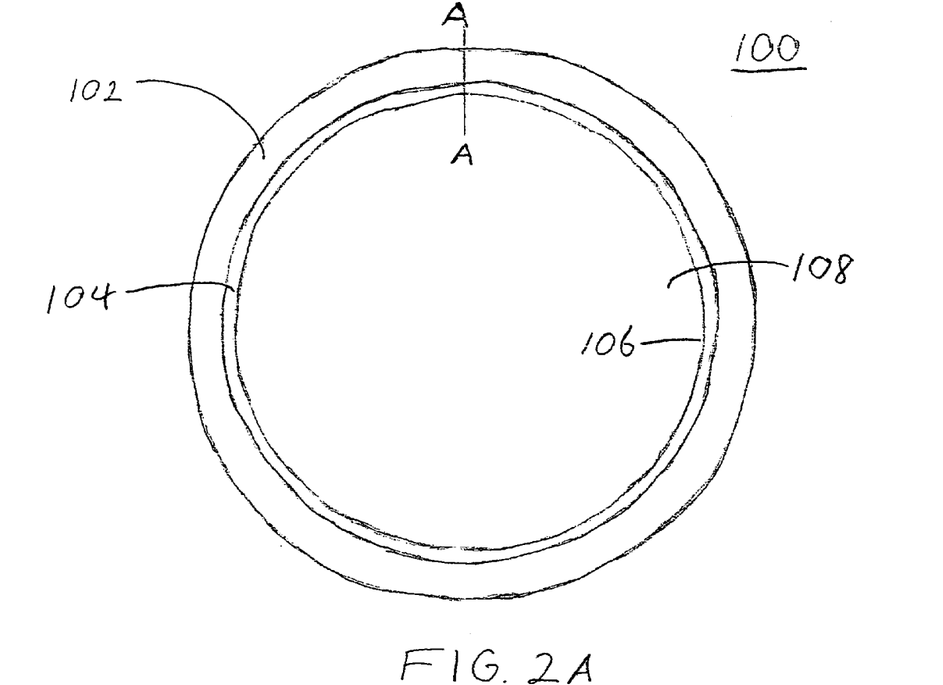
FIG. 2A is a top view of an edge ring composed of CVD deposited opaque, low resistivity silicon carbide.
Figure 2B:
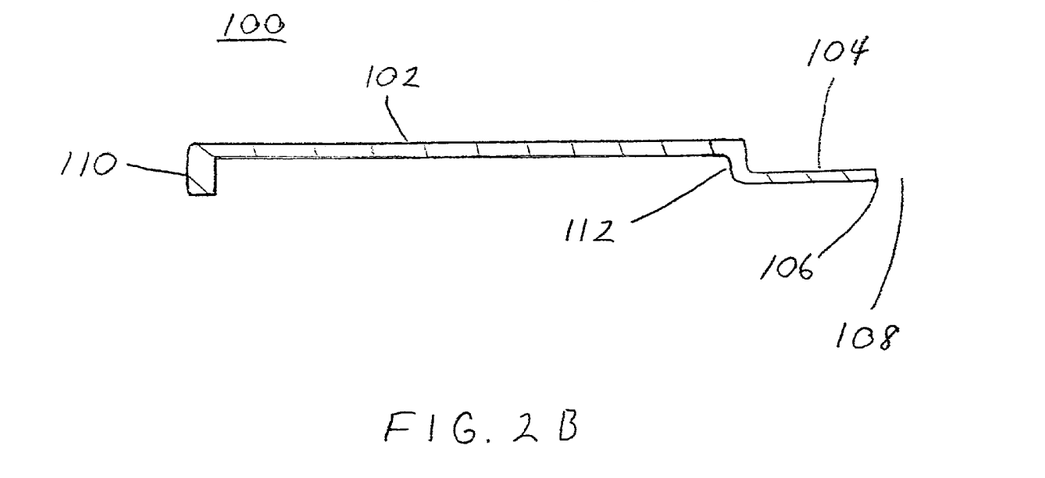
FIG. 2B is a cross-section of an edge ring composed of CVD deposited opaque, low resistivity silicon carbide.

FIGS. 2A and 2B show an edge ring machined and polished from a single piece of opaque, low resistivity silicon carbide within the scope of the present invention. Edge ring 100 has a circular circumference composed of main ring component 102 with wafer holding flange 104 continuous with main ring component 102. Wafer holding flange 104 terminates at edge 106 to form void 108. FIG. 2B is a cross-section of edge ring 100 along line A-A. Main ring component 102 terminates at an outer surface in support flange 110 that is continuous with main ring component 102. Main ring component 102 terminates at an inner surface with flange 112 which is continuous with wafer holding flange 104, thus securing wafer holding flange 104 to main ring component 102.

Although FIGS. 2A and 2B show an edge ring as a circular article, any suitable shape may be employed. A circular edge ring is illustrated in FIGS. 2A and 2B because many semi-conductor wafers are in a circular shape. Size and thickness of the edge ring may also vary. However, the thinner the edge ring, the more suitable the ring is for processing semi-conductor wafers. A thin edge ring can heat up faster in wafer processing furnaces than a relatively thick edge ring, thus reducing the amount of processing time. Thickness of opaque low resistivity silicon carbide edge rings may range from 0.1 mm to 1.0 mm, preferably from 0.25 mm to 0.5 mm.

The following examples are intended to further illustrate the present invention and are not intended to limit the scope of the invention.

EXAMPLE 1

An opaque, low resistivity silicon carbide was produced according to a method of the present invention in an apparatus similar to that illustrated in FIG. 1 with the following process conditions: deposition temperature=1350° C., total furnace pressure=300 torr, hydrogen partial pressure=92 torr, MTS partial pressure=17 torr, and nitrogen partial pressure=191 torr. The nitrogen partial pressure corresponded to 63.6% of nitrogen in the process. One inch equals 2.54 centimeters. Six resistivity samples were fabricated from different locations in one plate (24×29-inches). The resistivity values fell in the range of 0.057-0.071 ohm-cm. The average electrical resistivity of the six samples was 0.064 ohm-cm. The deposition thickness range was 0.24-0.564-inches yielding a deposition rate of 2.7-6.3 mil/hour. The silicon carbide was characterized for thermal conductivity by laser flash technique, solid phase $N_2$ concentration by secondary ion mass spectroscopy, and purity by gas discharge mass spectroscopy. The results are given below:

| Property | Value |
| --- | --- |
| Thermal conductivity | 232–257 W/mK |
| Solid phase $N_2$ conc. | 3–4.6 × $10^{19}$ atoms/cc |
| Chemical impurity | 1.14 (ppmw) |

The above property values showed that large amounts of $N_2$ incorporation did not significantly affect the important properties of silicon carbide. The thermal conductivity was high and exceeded 200 W/mK. The chemical impurities were less than 2 ppmw. Further, electrical resistivity was below 0.1 ohm-cm. Thus, the silicon carbide had reduced electrical resistivity values.

EXAMPLE 2

An opaque, low resistivity silicon carbide was produced according to a method of the present invention in an apparatus similar to that illustrated in FIG. 1 with the following process conditions: deposition temperature=1350° C., total furnace pressure=400 torr, hydrogen partial pressure=100 torr, MTS partial pressure=16 torr, and nitrogen partial pressure=284 torr. The nitrogen partial pressure corresponded to 72% of nitrogen in the process. Six resistivity samples were fabricated from different locations in one plate (24×29-inches).

The resistivity values fell in the range of 0.04–0.043 ohm-cm. The average resistivity of the six samples was 0.041 ohm-cm. The deposition thickness range for 78 hour deposition was 0.172–0.355-inches yielding a deposition rate of 2.2–4.5 mil/hour. The material was characterized as in Example 1 and the results are given below:

| Property | Value |
| --- | --- |
| Thermal conductivity | 227–283 W/mK |
| Solid phase $N_2$ conc. | $4.2 \times 10^{19}$ atoms/cc |
| Chemical impurity | 1.85 (ppmw) |

The above property values of CVD-SiC showed that large amounts of $N_2$ incorporation did not significantly affect the important properties of silicon carbide. As in Example 1, thermal conductivity was high and exceeded 200 W/mK. Chemical impurities were below 2.

EXAMPLE 3

An opaque, low resistivity silicon carbide was produced according to a method of the present invention in an apparatus similar to that illustrated in FIG. 1 with the following process conditions: deposition temperature=1350° C., total furnace pressure=650 torr, hydrogen partial pressure=110 torr, MTS partial pressure=17 torr, and nitrogen partial pressure=523 torr. The nitrogen partial pressure corresponds to 80% of nitrogen in the process. Six resistivity samples were fabricated from different locations in one plate (24×29-inches). The resistivity values fell in the range of 0.015–0.028 ohm-cm. The average resistivity was 0.021 ohm-cm. The deposition thickness range for 84 hours of deposition was 0.134–0.302-inches yielding a deposition rate of 1.6–3.6 mil/hour. The material was characterized as in Example 1 and the results are given below:

| Property | Value |
| --- | --- |
| Thermal conductivity | 220–257 W/mK |
| Solid phase $N_2$ conc. | $7.6 \times 10^{19}$ atoms/cc |
| Chemical impurity | 2.07 (ppmw) |

The above property values of CVD-SiC showed that large amounts of $N_2$ incorporation did not significantly affect the important properties of silicon carbide. As in Examples 1 and 2 above, silicon carbide made according to a method of the present invention had electrical resistivity values of less than 0.1 ohm-cm and maintained high thermal conductivity values as well as low impurities.

EXAMPLE 4

Four silicon carbide plates were prepared to show that the method of the present invention provides for opaque silicon carbide articles in the light wavelength range of from about 0.10 µm to about 1.0 µm. Two plates which acted as controls had a thickness of 0.0050 inches. Two plates that were prepared according to the method of the present invention had a thickness of 0.0055 inches.

The two plates that were prepared according to the method of the present invention were prepared according to the method described in Example 1 above except that deposition was stopped when the desired thickness of each plate was achieved.

The two control plates were prepared by chemical vapor deposition in a 1.5-m production furnace of Morton Advanced Materials, Woburn, Mass., with the following process conditions: deposition temperature=1350° C., total pressure=200 torr, hydrogen partial pressure=90 torr, MTS partial pressure=17 torr, and nitrogen partial pressure=93 torr. Deposition rate was 1.5 microns/minute.

After each test sample was prepared, each sample was mounted in a holder which was placed in front of a laser beam of appropriate wavelength. Opaqueness of each sample was determined by measuring each samples light transmission at a wavelength of 0.8 microns and 1.06 microns. A detector silicon was placed near the backside of each sample to measure the transmitted signal from the light source. The light source for the 0.8 microns wavelength was a titanium/sapphire laser, and the light source for the 1.06 microns wavelength was an yttrium/neodymium laser. Spot diameter on each sample was 4 mm. Incidence angle was 0° and pulse rate was 10 Hz. Each sample was exposed to 200 pulses of light at the respective wavelengths. The tests were done at room temperature (20° C.).

From the transmission values, the absorption coefficient was calculated for each sample taking the refractive index of SiC as 2.58 at 1.06 micron and 2.61 at 0.8 micron. The following formula was used to calculate the absorption coefficient:

$$\text{Absorption Coefficient} = -(1/t)\ln\{[((1-R)^4/4R^4T^2)+(1/R^2)]^{0.5} - ((1-R)^2/2R^2T)\}$$

Where t is sample thickness, T is fraction of light transmitted, R is fraction of light reflected which is calculated as follows:

$$R = [(1-n)^2/(1+n)^2]$$

The results of the test and calculations are given in the table below.

| Sample Number | Sample Thickness (inch) | Transmission at 1.06 microns (%) | Absorption Coefficient at 1.06 micron (cm$^{-1}$) | Transmission at 0.8 microns (%) | Absorption Coefficient at 0.8 micron (cm$^{-1}$) |
| --- | --- | --- | --- | --- | --- |
| Control 1 | 0.0050 | 0.279 | 429 | 5.13 | 199 |
| Control 2 | 0.0050 | 0.476 | 387 | 4.21 | 215 |
| Opaque 1 | 0.0055 | 0.038 | 533 | 1.72 | 259 |
| Opaque 2 | 0.0055 | 0.052 | 510 | 1.2 | 285 |

The data showed that the amount of light transmission in the samples prepared by the method of the present invention (opaque 1 and 2) had reduced light transmissions and higher absorption coefficient at both wavelengths. In contrast, the controls which were not prepared by doping silicon carbide with as much nitrogen had higher transmissions and lower absorption coefficients at both wavelengths. Accordingly, the silicon carbide of the present invention had improved opacity over silicon carbide prepared by the lower nitrogen doping process.

What is claimed is:

1. A method of making a silicon carbide article comprising reacting silicon carbide precursors in a nitrogen atmosphere of at least 56% by volume of reactants and depositing the silicon carbide on a substrate.

2. The method of claim 1, wherein the nitrogen ranges from 56% to 90% by volume of reactants.

3. The method of claim 2, wherein the nitrogen ranges from 60% to 90% by volume of reactants.

4. The method of claim 1, wherein a total pressure is at least 300 torr.

5. The method of claim 4, wherein the total pressure is from 300 torr to 835 torr.

6. The method of claim 5, wherein the total pressure is from 320 torr to 700 torr.

7. The method of claim 1, wherein temperatures range from 1250° C. to 1400° C.

8. The method of claim 1, wherein a source of nitrogen comprises $N_2(g)$, volatile amine compounds, or mixtures thereof.

9. The method of claim 8, wherein a source of nitrogen comprises $NF_3$, $NH_3$ or mixtures thereof.

10. The method of claim 1, further comprising the steps of removing the silicon carbide from the substrate, and machining and polishing the silicon carbide into an edge ring.

* * * * *